(12) United States Patent
Shen et al.

(10) Patent No.: US 9,942,961 B2
(45) Date of Patent: Apr. 10, 2018

(54) BACKLIGHT MODULE AND DISPLAY APPARATUS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Qiyu Shen, Beijing (CN); Xu Chen, Beijing (CN); Jian Guo, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 317 days.

(21) Appl. No.: 14/429,042

(22) PCT Filed: Jun. 20, 2014

(86) PCT No.: PCT/CN2014/080428
§ 371 (c)(1),
(2) Date: Mar. 18, 2015

(87) PCT Pub. No.: WO2015/106536
PCT Pub. Date: Jul. 23, 2015

(65) Prior Publication Data
US 2016/0014866 A1    Jan. 14, 2016

(30) Foreign Application Priority Data

Jan. 16, 2014 (CN) .......................... 2014 1 0019355

(51) Int. Cl.
*G09F 13/04* (2006.01)
*H05B 33/08* (2006.01)
(Continued)

(52) U.S. Cl.
CPC ... *H05B 33/0896* (2013.01); *G02F 1/133603* (2013.01); *H01L 51/5215* (2013.01);
(Continued)

(58) Field of Classification Search
USPC ...................................... 362/97.1, 97.2, 97.3
See application file for complete search history.

(56) References Cited

U.S. PATENT DOCUMENTS 7,982,398 B2    7/2011  Koo et al.
2009/0262281 A1* 10/2009  Yun ................... G02F 1/133606
                                                  349/64
(Continued)

FOREIGN PATENT DOCUMENTS

CN    101086581 A    12/2007
CN    101226955 A    7/2008
(Continued)

OTHER PUBLICATIONS

International Search Report with Notice of Transmittal of the International Search Report of PCT/CN2014/080428 in Chinese, dated Oct. 27, 2014.
(Continued)

*Primary Examiner* — Ahshik Kim
(74) *Attorney, Agent, or Firm* — Collard & Roe, P.C.

(57) ABSTRACT

A backlight module and a display apparatus are provided. The backlight module comprises a backlight source and optical sheets, wherein the backlight source is an organic electroluminescent device, the optical sheets are directly adhered to a light emitting side of the organic electroluminescent device facing a display panel. The light emitted by the organic electroluminescent device is directed emitted after passing through the optical sheets. The display apparatus comprises such a backlight module. A thickness of such backlight module can be efficiently reduced.

18 Claims, 2 Drawing Sheets

(51) Int. Cl.
*G02F 1/1335* (2006.01)
*H05B 33/28* (2006.01)
*H01L 51/52* (2006.01)
*G02F 1/133* (2006.01)

(52) U.S. Cl.
CPC ......... *H01L 51/5234* (2013.01); *H05B 33/28* (2013.01); *G02F 2001/13324* (2013.01); *H01L 51/5253* (2013.01); *H01L 51/5281* (2013.01); *H01L 2251/5323* (2013.01); *H01L 2251/5361* (2013.01)

(56) References Cited

U.S. PATENT DOCUMENTS

| | | | |
|---|---|---|---|
| 2011/0013098 A1 | 1/2011 | Jung et al. | |
| 2011/0133674 A1* | 6/2011 | Yoo | G02F 1/133603 315/312 |
| 2013/0000690 A1 | 1/2013 | Liu | |
| 2013/0258243 A1 | 10/2013 | Zhou et al. | |
| 2015/0109755 A1* | 4/2015 | Noguchi | G02B 6/0056 362/19 |

FOREIGN PATENT DOCUMENTS

| | | |
|---|---|---|
| CN | 101295096 A | 10/2008 |
| CN | 102856400 A | 1/2013 |
| CN | 102966912 A | 3/2013 |
| CN | 102967979 A | 3/2013 |
| CN | 103216780 A | 7/2013 |
| CN | 203115714 U | 8/2013 |
| CN | 103346164 A | 10/2013 |
| CN | 203367368 U | 12/2013 |
| CN | 103807727 A | 5/2014 |
| JP | 2008197244 A | 8/2008 |
| JP | 2011-23347 A | 2/2011 |

OTHER PUBLICATIONS

Written Opinion of the International Searching Authority of PCT/CN2014/080428 in Chinese with English translation dated Oct. 27, 2014.
Second Office Action issued by the Chinese Patent Office for Application No. CN201410019355.5 dated Sep. 30, 2015 in Chinese with an English translation.
Chinese Office Action of Chinese Application No. 201410019355.5, dated Jun. 23, 2015 with English translation.

* cited by examiner

BACKLIGHT MODULE AND DISPLAY APPARATUS

CROSS REFERENCE TO RELATED APPLICATIONS

This application is the National Stage of PCT/CN2014/080428 filed on Jun. 20, 2014, which claims priority under 35 U.S.C. § 119 of Chinese Application No. 201410019355.5 filed on Jan. 16, 2014, the disclosure of which is incorporated by reference.

TECHNICAL FIELD

Embodiments of the present invention relate to a backlight module and a display apparatus.

BACKGROUND

It is well known that a liquid crystal display (LCD) is not a self-illumination display apparatus, and a backlight module becomes a key component of the liquid crystal display for providing a light source with sufficient illuminance and uniform distribution, so that the liquid crystal display can display images normally.

Currently, the backlight module known by the inventor is mainly composed of a backlight source, a light guide panel (LGP) and optical sheets. For the backlight source, a cold cathode fluorescent lamp or a light emitting diode (LED) is mainly employed. The light guide panel is used to change path of the light and direct the light of the backlight source in the desired direction. The optical sheets are used to condense the light so that the light emitted from the backlight module becomes uniform.

With the development of the display apparatus towards to lighter and slimmer, it is desired that the backlight module becomes thinner and thinner. In backlight modules known by the inventor, as the backlight source is the CCFL or the LED, usually, it needs to provide a light guide panel to guide the light emitted from the backlight source, and the finally formed backlight module has a relative large thickness, and is adverse to make an ultra-slim display apparatus.

Therefore, how to reduce the thickness of the backlight module is a technical problem to be solved urgently by the person skilled in the art.

SUMMARY

Embodiments of the present disclosure provide a backlight module and a display apparatus for reducing a thickness of the backlight module and thus reducing a thickness of the display apparatus.

At least one embodiment of the present disclosure provides a backlight module comprising a backlight source and optical sheets, wherein:

the backlight source comprises an organic electroluminescent device;

the optical sheets are directly adhered to a light emitting side of the backlight source facing a display panel, and the light emitted from the backlight source is directly emitted after passing through the optical sheets.

In the backlight module according to the present embodiment, since a backlight source comprising an organic electroluminescent device is employed, the backlight source is configured to emit from its entire surface. Compared with the prior art backlight module, it is not necessary to provide a light guide panel individually, and thus a thickness of the backlight module can be reduced, and hence a thickness of the display apparatus can be reduced. Furthermore, as the optical sheets are directly adhered to the light emitting side of the organic electroluminescent device facing the display panel, the organic electroluminescent device is directly used as a support of the optical sheets, the substrate individually used for carrying the optical sheets can be saved, and thus the thickness of the display apparatus employing the backlight module can be further reduced.

In an embodiment of the present disclosure, in order to effectively utilize the light emitted from the backlight source, the organic electroluminescent device emits light at both sides, and the backlight module further comprises a photovoltaic cell panel located at a side of the organic electroluminescent device opposite to the optical sheets, for converting the light emitted from the side of the organic electroluminescent device opposite to the optical sheets into electric energy.

In an embodiment of the present disclosure, for easy implementation, the backlight module further comprises an energy storage battery electrically connected to the photovoltaic cell panel for storing the electric energy generated by the photovoltaic cell panel.

In an embodiment of the present disclosure, for effectively utilizing the light emitted from the backlight source, the energy storage battery is electrically connected to driving chips of the display panel to power the display panel; and/or the energy storage battery is electrically connected to the driving chips of the organic electroluminescent device to power the organic electroluminescent device.

In an embodiment of the present disclosure, in order to prevent oxygen and moisture in the air from influencing the performance of the organic electroluminescent device, the backlight source further comprises a first substrate and a second substrate disposed opposite to each other and a frame glue sealing edges of the first substrate and the second substrate, wherein the organic electroluminescent device is disposed in an light emitting space surrounded by the first substrate, the second substrate and the frame glue;

The optical sheets are disposed at a side of the first substrate facing away from the organic electroluminescent device, and the photovoltaic cell panel is disposed at a side of the second substrate facing away from the organic electroluminescent device.

In an embodiment of the present disclosure, the orthographic projection of the photovoltaic cell panel on the second substrate at least covers the orthographic projection of the organic electroluminescent device on the second substrate.

In an embodiment of the present disclosure, in order to further prevent the organic electroluminescent device from being influenced by the air and the moisture, the backlight source further comprises desiccant located in the emitting space surrounded by the first substrate, the second substrate and the plastic frame.

In an embodiment of the present disclosure, for easy implementation, each of the first and the second substrates of the backlight source is a glass substrate.

In an embodiment of the present disclosure, for facilitating the implementation, the organic electroluminescent device comprises an anode, an emitting layer and a cathode provided in a stack, wherein each of the anode and the cathode is a transparent electrode.

In an embodiment of the present disclosure, for easy implementation, material for the cathode is Nano-silver material.

In an embodiment of the present disclosure, for easy implementation, the organic electroluminescent device further comprises a cathode modification layer disposed between the cathode and the emitting layer.

In an embodiment of the present disclosure, for easy implementation, the material for the cathode modification layer is lithium fluoride (LiF).

In an embodiment of the present disclosure, for easy implementation, the optical sheets comprise a light homogenizing film, an reflection reduction film, and a protection film provided in stack.

Embodiments of the present disclosure provide a display apparatus comprises any one of the backlight modules as provided by the above embodiments of the present disclosure.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

The size and shape of the components in the attached figures are only intended to illustrate the embodiments of the present disclosure and are not drawn in scale.

Figure 1:
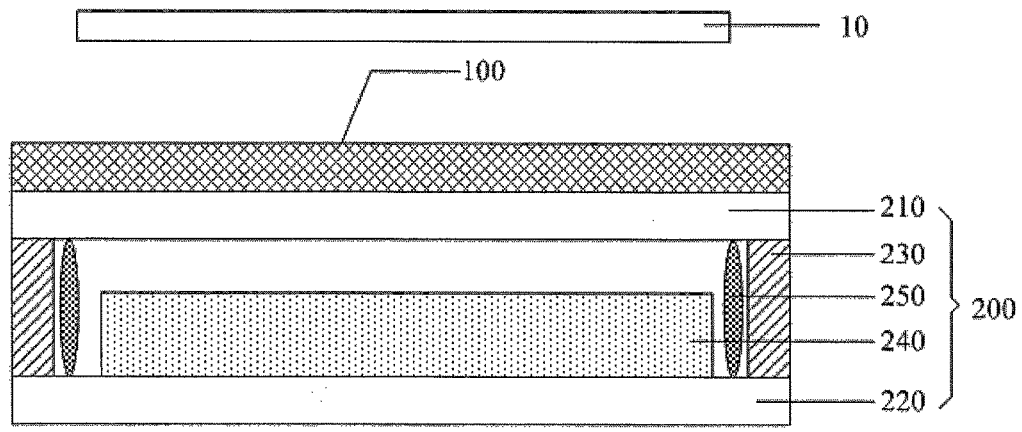
FIG. 1 is a schematic structural view of the backlight module provided by an embodiment of the present disclosure.

As illustrated in FIG. 1, a backlight module according to an embodiment of the present disclosure comprises a backlight source and optical sheets 100, wherein:

the backlight source 200 comprises an organic electroluminescent device 240, the optical sheets 100 are directly adhered to a light emitting side of the backlight source 200 facing a display panel 10, and the light emitted by the backlight source 200 is directly incident into the display panel through the optical sheets 100.

In the above backlight module according to the embodiment, the backlight source 200 is composed of the organic electroluminescent device 240, and can be configured to emit light from its entire surface. Therefore, compared with the backlight module known by the inventor, no light guide panel is individually provided, thus a thickness of the backlight module can be reduced, and hence a thickness of a display apparatus utilizing this backlight module can be reduced. In addition, since the optical sheets are directly adhered to the light emitting side of the organic electroluminescent device facing the display panel, the organic electroluminescent device can be directly used as the carrier for the optical sheets, and a substrate dedicated for carrying the optical sheets is saved, and thus the thickness of the display device can be further reduced.

And furthermore, in the above backlight module according to the embodiment, the organic electroluminescent device can emit white light, and can also emit other color light as desired, which is not limited here.

And furthermore, in the backlight module according to the embodiment, the backlight source 200 can emit light from both sides, and the light emitted at a side facing the optical sheets 100 is used to provide light for the display panel, and in order to efficiently utilize the light emitted from the side of the backlight source 200 facing away from the optical sheets, the backlight module can further comprise a photovoltaic cell panel 300 disposed at the side of the backlight 200 facing away from the optical sheets 100 for converting the light emitted from the side of the backlight source 200 facing away from the optical sheets 100 into electrical energy, and thus the light energy emitted by the backlight source can be efficiently utilized.

In the backlight module provided according to the embodiment, the photovoltaic cell panel can be the same as the photovoltaic cell panel as known by the inventor, and will not be further described any more.

Figure 2:
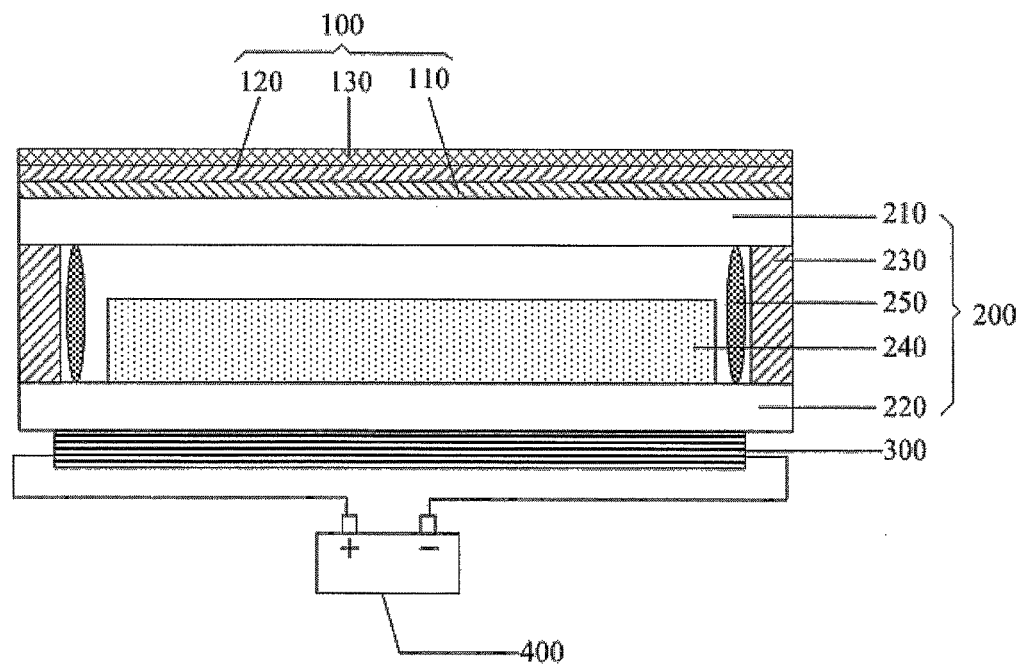
FIG. 2 is another schematic structural view of the backlight module provided by an embodiment of the present disclosure.

For easy implementation, according to an embodiment of the present disclosure, as illustrated in FIG. 2, the backlight module further comprises a storage battery 400 electrically connected to the photovoltaic cell panel 300 for storing the electrical energy generated by the photovoltaic cell panel 300. The photovoltaic cell panel converts light energy into electrical energy which is stored in the storage battery, the storage battery can supply the electrical energy stored therein to the organic electroluminescent device or the display panel, there is no limitation.

Furthermore, in the backlight module according to an embodiment of the present disclosure, the storage battery is electrically connected to driving chips of the display panel to power the display panel, and/or the storage battery is electrically connected to driving chips of the organic electroluminescent device to power the organic electroluminescent device.

In the above embodiment, light emitted from the side of the backlight source facing away from the display panel is converted into electrical energy by the photovoltaic cell panel, and then is stored in the storage battery. The stored electrical energy is supplied to the backlight source via the driving chips of the backlight source as its power supply or the stored electrical energy is supplied to circuits in the respective display panel via the driving chips of the display panel or is supplied to other electric consuming devices as their power supply. Thus, the electrical energy can be sufficiently utilized and the object of saving energy can be achieved.

In order to prevent the oxygen and moisture in the air from influencing the performance of the organic electroluminescent device, in the backlight module according to the embodiment of the present disclosure, as illustrated in FIG. 1, the backlight source 200 comprises a first substrate 210 and a second substrate 220 provided opposite to each other, and a frame glue 230 sealing edges of the first substrate 210 and the second substrate 220, the organic electroluminescent device 240 is disposed in the light emitting space surrounded by the first substrate 210, the second substrate 220 and the frame glue 230, the optical sheets are disposed at a side of the first substrate 210 facing away from the organic electroluminescent device 240, and the photovoltaic cell panel 300 is disposed at a side of the second substrate 220 facing away from the organic electroluminescent device 240.

In order to utilize the light energy emitted by the organic electroluminescent device from the second substrate to the maximum extent, in the backlight module according to the embodiment of the present disclosure, projection of the photovoltaic cell panel on the second substrate 220 at least covers projection of the organic electroluminescent device 240 on the second substrate.

In the above backlight module according to the embodiment of the present disclosure, as illustrated in FIG. 1, the backlight source 200 further comprises desiccant 250 disposed in the light emitting space surrounded by the first substrate 210, the second substrate 220 and the frame glue 230. The provision of the desiccant 250 in the light emitting space is used to absorb little amount of the oxygen and moisture which penetrates into the light emitting space through gaps formed between the frame glue and the upper and lower substrates due to poor sealing of the light emitting space, and thus further preventing the organic electroluminescent device 240 from being influenced by the moisture and oxygen.

In the backlight module provided according to an embodiment of the present disclosure, each of the first substrate and the second substrate can be a glass substrate, of course, the first substrate and the second substrate can also use the substrate formed from other material for implementing the solution of the present disclosed embodiment, as long as the substrate can transmits light, and there is no limitation thereon.

Furthermore, as illustrated in FIG. 2, in the backlight module as provided according to an embodiment of the present disclosure, the optical sheets 100 can comprise a light homogenizing film 110, a reflection reduction film 120, and a protection film 130 provided in a stack. For example, the light homogenizing film 110 is directly located on a side of the first substrate 210 facing away from the organic electroluminescent device 240 for making the light emitted by the organic electroluminescent device 240 uniformly distributed, to provide a uniform light source to the display panel. The reflection reduction film 120 is for enhancing the transmittance of the light passed through the light homogenizing film to the maximum extent. The protection film 130 is for protecting the reflection reduction film 120 and the light homogenizing film 110, from mechanical damages.

Figure 3:
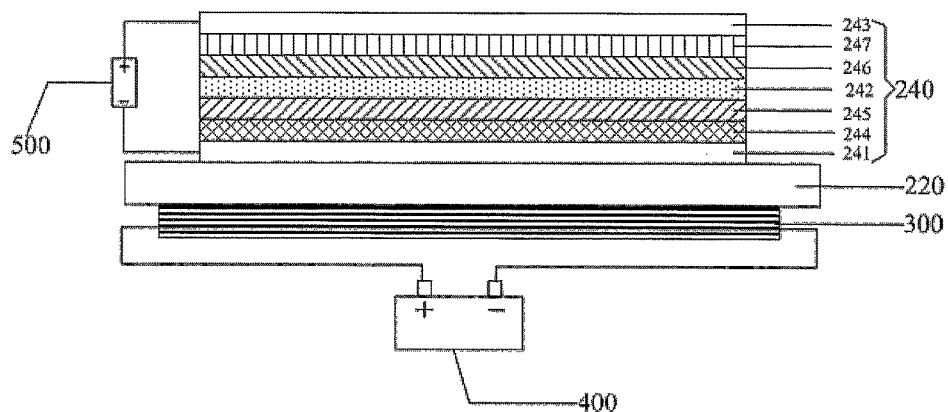
FIG. 3 is a schematic structural view of the organic electroluminescent device provided by an embodiment of the present disclosure.

As illustrated in FIG. 3, in the backlight module according to an embodiment of the present disclosure, the organic electroluminescent device 240 comprises a cathode 241, a light emitting layer 242 and an anode 243 provided in stack, wherein:

The cathode 241 and the anode 243 each is a transparent electrode such that the light emitted from both sides of the organic electroluminescent device can be utilized.

In the backlight module provided according to an embodiment of the present disclosure, as illustrated in FIG. 3, by connecting the cathode 241 with a negative electrode of a driving chip 500 of the organic electroluminescent device 240 and connecting the anode 243 with a positive electrode of the driving chip 500 of the organic electroluminescent device 240, Voltage can be applied on the organic electroluminescent device 240, and thus making the organic electroluminescent device 240 emit light.

In the backlight module provided according to an embodiment of the present disclosure, the cathode is located on the second substrate, and material for the cathode is nano silver organic material with low work function. Of course, the cathode can also be formed of other material capable of implementing the solution of the present disclosure, and there is no limitation thereon. Furthermore, a thickness of the nano silver organic material is controlled to be within a range from 500 nm to 1000 nm.

The anode is formed by Indium Tin Oxide material. Of course, the anode can be formed by other material capable of implementing the solution of the present disclosure, and there is no limitation thereon.

In the backlight module provided according to an embodiment of the present disclosure, as illustrated in FIG. 3, the organic electroluminescent device 240 can also comprise a cathode modification layer 244 disposed between the cathode 241 and the light emitting layer 242.

In the backlight module according to an embodiment of the present disclosure, the cathode modification layer facilitates the injection of electrons, and improves electron injection rate. The cathode modification layer can be formed of lithium fluoride (LiF), but there is no limitation thereon. A thickness of the LiF is controlled to be within a range of 1 nm to 5 nm.

Furthermore, in the backlight module according to an embodiment of the present disclosure, as illustrated in FIG. 3, the organic electroluminescent device 240 can further comprise an electron transport layer 245 disposed between the cathode modification layer 244 and the light emitting layer 242, and a hole transport layer 246 and a hole buffer layer 247 subsequently disposed between the light emitting layer 242 and the anode 243.

In the backlight module according to the above embodiments, the electron transport layer is used to transport electrons during electroluminescence. Material for the electron transport layer can be Tris(8-hydroxyquinolinato)aluminum (Alq3), but there is no limitation thereon. The electron transport layer can be formed by depositing an Alq3 film on the cathode modification layer through a vacuum evaporation process. Furthermore, a thickness of the Alq3 film is controlled in a range of 15 nm to 30 nm.

In the backlight module according to the above embodiment, The light emitting layer can be formed by ammonium dinitramide (ADN) doped with 2,5,8,11-Tetra-tert-butylperylene (TBPE) and 4-(Dicyanomethylene)-2-tert-butyl-6-(1,1,7,7-tetramethyljulolidin-4-yl-vinyl)-4H-pyran (DCJTB). Furthermore, a thickness of the AND is controlled to be about 30 nm, and at the same time, the doping concentration of the TBPE is controlled in a range of 1% to 2%, and the doping concentration of the DCJTB is controlled in a range of 1% to 3%.

In the backlight module according to the above embodiment, the hole transport layer can be formed by N,N'-Bis-(1-naphthalenyl)-N,N-bis-phenyl-(1,1'-biphenyl)-4,4'-diamine (NPB), but there is no limitation thereon. Furthermore, a thickness of the NPB is controlled in a range of 20 nm to 30 nm.

In the backlight module according to the above embodiment, the hole buffer layer can be formed by 4,4'4'-Tris(N-(2-naphthyl)-N-phenyl-amino)-triphenylamine (2T-NATA), but there is no limitation thereon. Furthermore, a thickness of the 2T-NATA is controlled in a range of 10 nm to 20 nm.

Based on the same design concept, at least one embodiment of the present disclosure further provides a display apparatus comprising the backlight module according to the above embodiment of the present disclosure, the display apparatus can be any product or component with display function such as a mobile phone, a tablet computer, a television, a monitor, a laptop computer, a digital photo frame, navigator, and so on. Other essential components for the display apparatus are well known to those skilled in the art as the components which should be incorporated, which will not described herein, and also will not be construed as limitations on the present disclosure. Implementation of the display apparatus can be done by referring to the above embodiments of the backlight module, and will not repeatedly described.

Embodiments of the present disclosure provide a backlight module and a display apparatus, the backlight module comprises a backlight source and optical sheets, the backlight source comprises an organic electroluminescent device, the optical sheets are directly adhered to a light emitting side of the backlight source facing a display panel so that light emitted by the backlight source can be directly incident into the display panel through the optical sheets. In such a backlight module, the backlight source comprises an organic electroluminescent device, and can be configured to emit light from the whole surface, and therefore, compared with backlight modules known by the inventor, there is no need to provide a light guide panel, and thus a thickness of the backlight module can be reduced, hence a thickness of the display apparatus can be reduced. In addition, since the optical sheets are directly adhered to the light emitting side of the backlight source facing the display panel, the backlight source can be directly used as a carrier for the optical sheets, a substrate dedicated for carrying the optical sheets can be saved, and thus the thickness of the display apparatus can be further reduced.

The foregoing are merely exemplary embodiments of the invention, but are not used to limit the protection scope of the invention. The protection scope of the invention shall be defined by the attached claims.

The present application claims the priority of Chinese Patent Application No.; 201410019355.5, filed on Jan. 16, 2014, the disclosure of which is hereby entirely incorporated by reference.

The invention claimed is:

1. A backlight module comprising a backlight source and optical sheets, wherein the backlight source comprises an organic electroluminescent device;
the optical sheets are directly adhered to a light emitting side of the backlight source facing a display panel so that the light emitted by the organic electroluminescent device is directly emitted after passing through the optical sheets; and
wherein the backlight source further comprises a first substrate and a second substrate provided opposite to each other, and a frame glue sealing and connecting edges of the first substrate and the second substrate, wherein the organic electroluminescent device is disposed in a light emitting space surrounded by the first substrate, the second substrate and the frame glue.

2. The backlight module according to claim 1, wherein the organic electroluminescent device emits light from both sides, and the backlight module further comprises:
a photovoltaic cell panel disposed at a side of the organic electroluminescent device facing away from the optical sheets and configured to convert the light emitted from the side of the organic electroluminescent device facing away from the optical sheets into electrical energy.

3. The backlight module according to claim 2, further comprising a storage battery electrically connected to the photovoltaic cell panel and configured to store the electrical energy generated by the photovoltaic cell panel.

4. The backlight module according to claim 3, wherein the storage battery is electrically connected to the display panel to power the display panel; and/or
the storage battery is electrically connected to the organic electroluminescent device to power the organic electroluminescent device.

5. The backlight module according to claim 4, wherein the optical sheets are disposed at a side of the first substrate facing away from the organic electroluminescent device, and the photovoltaic cell panel is disposed at a side of the second substrate facing away from the organic electroluminescent device.

6. The backlight module according to claim 3, wherein the optical sheets are disposed at a side of the first substrate facing away from the organic electroluminescent device, and the photovoltaic cell panel is disposed at a side of the second substrate facing away from the organic electroluminescent device.

7. The backlight module according to claim 3, wherein orthographic projection of the photovoltaic cell panel on the second substrate at least covers orthographic projection of a region where the organic electroluminescent device is located on the second substrate.

8. The backlight module according to claim 2, wherein orthographic projection of the photovoltaic cell panel on the second substrate at least covers orthographic projection of a region where the organic electroluminescent device is located on the second substrate.

9. The backlight module according to claim 2, wherein the optical sheets are disposed at a side of the first substrate facing away from the organic electroluminescent device, and the photovoltaic cell panel is disposed at a side of the second substrate facing away from the organic electroluminescent device.

10. The backlight module according to claim 1, wherein the optical sheets are disposed at a side of the first substrate facing away from the organic electroluminescent device, and the photovoltaic cell panel is disposed at a side of the second substrate facing away from the organic electroluminescent device.

11. The backlight module according to claim 1, wherein the backlight source further comprises desiccant disposed in the emitting space surrounded by the first substrate, the second substrate and the frame glue.

12. The backlight module according to claim 1, wherein the first substrate and the second substrate each is a glass substrate.

13. The backlight module according to claim 1, wherein the organic electroluminescent device comprises an anode, a light emitting layer and a cathode provided in stack; and wherein
the anode and the cathode each is a transparent electrode.

14. The backlight module according to claim 13, wherein the cathode is formed of nano silver material.

15. The backlight module according to claim 13, wherein the organic electroluminescent device further comprises a cathode modification layer disposed between the cathode and the light emitting layer.

16. The backlight module according to claim 15, wherein material for the cathode modification layer is lithium fluoride (LiF) material.

17. The backlight module according to claim 1, wherein the optical sheets comprise a light homogenizing film, a reflection reduction film, and a protection film provided in stack.

18. A display apparatus comprising a backlight module, wherein the backlight module comprising a backlight source and optical sheets, wherein the backlight source comprises an organic electroluminescent device;
   the optical sheets are directly adhered to a light emitting side of the backlight source facing a display panel so that the light emitted by the organic electroluminescent device is directly emitted after passing through the optical sheets; and
   wherein the backlight source further comprises a first substrate and a second substrate provided opposite to each other, and a frame glue sealing and connecting edges of the first substrate and the second substrate, wherein the organic electroluminescent device is disposed in a light emitting space surrounded by the first substrate, the second substrate and the frame glue.

* * * * *